United States Patent
Miyashita et al.

(10) Patent No.: US 7,223,646 B2
(45) Date of Patent: May 29, 2007

(54) MANUFACTURING METHOD OF SEMICONDUCTOR DEVICE SUPPRESSING SHORT-CHANNEL EFFECT

(75) Inventors: Toshihiko Miyashita, Kawasaki (JP); Kunihiro Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/192,424

(22) Filed: Jul. 29, 2005

(65) Prior Publication Data

US 2006/0220114 A1    Oct. 5, 2006

(30) Foreign Application Priority Data

Mar. 30, 2005  (JP)  ............................. 2005-099802

(51) Int. Cl.
*H01L 21/336* (2006.01)
(52) U.S. Cl. ..................... 438/197; 438/198; 438/199; 438/212; 438/213; 438/216; 438/217; 257/E21.632
(58) Field of Classification Search ................ 438/212, 438/213, 216, 217, 197–199, 289
See application file for complete search history.

(56) References Cited

U.S. PATENT DOCUMENTS

2004/0207011 A1 * 10/2004 Iwata et al. ................. 257/341

2006/0157732 A1 * 7/2006 Von Kaenel et al. ....... 257/190

FOREIGN PATENT DOCUMENTS

JP        2003-086706 A        3/2003
JP        2004153246 A    *    5/2004

OTHER PUBLICATIONS

Patent Abstracts of Japan, Publication No. 2004153246, dated May 27, 2004.
Korean Office Action dated Oct. 27, 2006, issued in corresponding Korean patent application No. 10-2005-0067180.

* cited by examiner

Primary Examiner—Matthew Smith
Assistant Examiner—Thanh V. Pham
(74) Attorney, Agent, or Firm—Westerman, Hattori, Daniels & Adrian, L.L.P.

(57) ABSTRACT

An ideal step-profile in a channel region is realized easily and reliably, whereby suppression of the short-channel effect and prevention of mobility degradation are achieved together. A silicon substrate is amorphized to a predetermined depth from a semiconductor film, and impurities to become the source/drain are introduced in this state. Then the impurities are activated, and the amorphized portion is recrystallized, by low temperature solid-phase epitaxial regrowth. With the processing temperature required for the low temperature solid-phase epitaxial regrowth being within a range of 450° C.–650° C., thermal diffusion of the impurities into the semiconductor film is suppressed, thereby maintaining the initial steep step-profile.

7 Claims, 5 Drawing Sheets

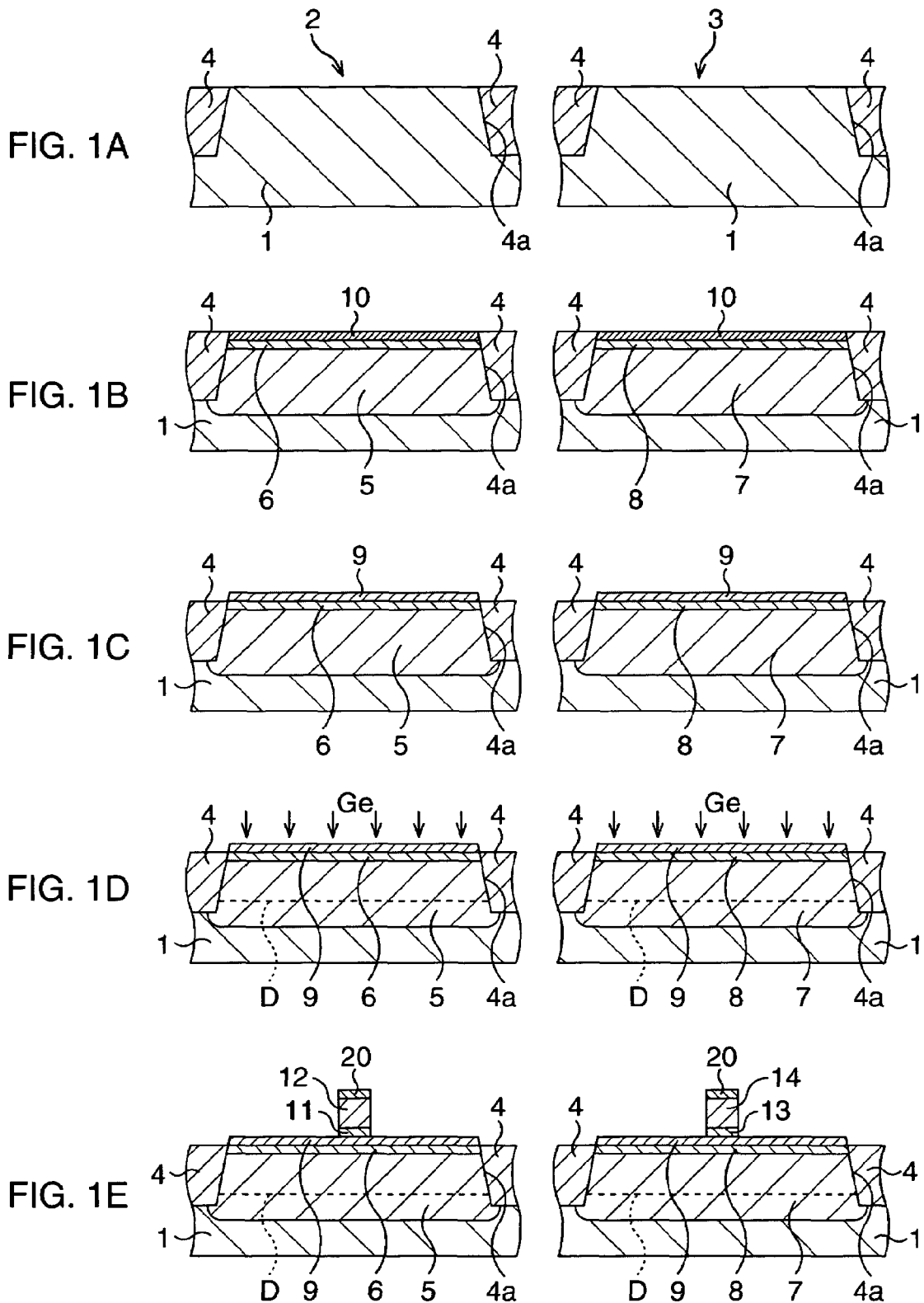

MANUFACTURING METHOD OF SEMICONDUCTOR DEVICE SUPPRESSING SHORT-CHANNEL EFFECT

CROSS-REFERENCE TO RELATED APPLICATIONS

This application is based upon and claims the benefit of priority from the prior Japanese Patent Application No. 2005-099802, filed on Mar. 30, 2005, the entire contents of which are incorporated herein by reference.

BACKGROUND OF THE INVENTION

1. Field of the Invention

The present invention relates to a semiconductor device for MOS transistors or the like and a manufacturing method thereof, and more particularly to a semiconductor device suitably applicable for high-performance CMOS transistors or the like and a manufacturing method thereof.

2. Description of the Related Art

In recent years, request for further miniaturization of CMOS transistors has been rising, propelling efforts to shorten the gate length in order to meet this request. However, pursuit of shorter gate lengths brings about a problem of the so-called short-channel effect. Therefore, methods have been devised to suppress the short-channel effect by increasing the impurity concentration in the channel region. However, increasing the impurity concentration in the channel region causes degradation of carrier mobility due to impurity scattering, which may result in obstruction to increase the drive current. As thus, when attempting to shorten the gate length, the request for suppressing the short-channel effect and the request for preventing degradation of carrier mobility are in a trade-off relation.

To address the above-stated problems, so-called epi channel transistors or retrograde channel transistors have been proposed as an ideal device structure which does not bring about mobility degradation, while suppressing the short-channel effect. For such transistors, the surface layer of the channel region is kept having an extremely low impurity concentration or in a non-doped state, whereas lower layers have a higher impurity concentration. In such transistors, mobility degradation due to impurity scattering is suppressed because carriers move in the inversion layer formed on the surface layer, while elongation of drain depletion layer is prevented by the highly doped lower layer under the surface layer, resulting in suppression of the short channel effect.

[Patent Document 1] Japanese Patent Application Laid-open No. 2004-153246

However, although the above-stated transistor structure is ideal as a configuration model of a device, currently there is no preferable approach devised for realizing such a structure. In particular, for the epi channel transistor, such an ideal step-profile of impurity concentration has been extremely difficult to realize, because impurities are diffused during activation annealing or other heat processes.

SUMMARY OF THE INVENTION

It is an object of the present invention, which has been made in view of the above-mentioned problems, to provide a highly reliable semiconductor device and its manufacturing method by which an ideal step-profile in the channel region is easily and repeatably realized which simultaneously achieves suppression of the short-channel effect and prevention of mobility degradation, and which furthermore can cope with further shortening channel-lengths.

A manufacturing method of the semiconductor device of the present invention comprises a process of introducing the first impurities of the first conductivity type into the semiconductor region of a semiconductor substrate, and activating the first impurity; a process of forming a thin semiconductor film on the semiconductor region; a process of amorphizing the semiconductor region to a predetermined depth from the semiconductor film; a process of patterning a gate electrode on the amorphized semiconductor film through a gate insulator; a process of introducing the second impurities of the second conductivity type into the semiconductor region from the semiconductor film at both sides of the gate electrode, and forming a source region and a drain region; a process of activating the second impurity introduced, and recrystallizing the amorphized portion of the semiconductor film and the semiconductor region, by performing heat treatment.

A semiconductor device of the present invention comprises a semiconductor substrate having an active region defined thereon and having the first impurities of the first conductivity type introduced into the active region; a source region and a drain region formed by introducing the second impurities of the second conductivity type into the active region; and a gate electrode patterned, through a gate insulator, on a channel region between the source region and the drain region of the active region, wherein the active region has a residual defect plane formed on a portion which is deeper than the depth of the junction plane between the source (or the drain) and the interior region, a region from the surface to the residual defect plane is recrystallized from the amorphous condition, and the channel region, with its surface layer substantially not containing impurities, is formed so that the concentration of the first impurity increases in a steep, step-wise manner at the interface between the surface layer and the interior.

BRIEF DESCRIPTION OF THE DRAWINGS

FIGS. 1A to 1E are schematic cross-sectional views illustrating the manufacturing method of CMOS transistors according to the present embodiment in the order of processing.

DETAILED DESCRIPTION OF THE PREFERRED EMBODIMENTS

Basic Gist of the Present Invention

Figure 2A:
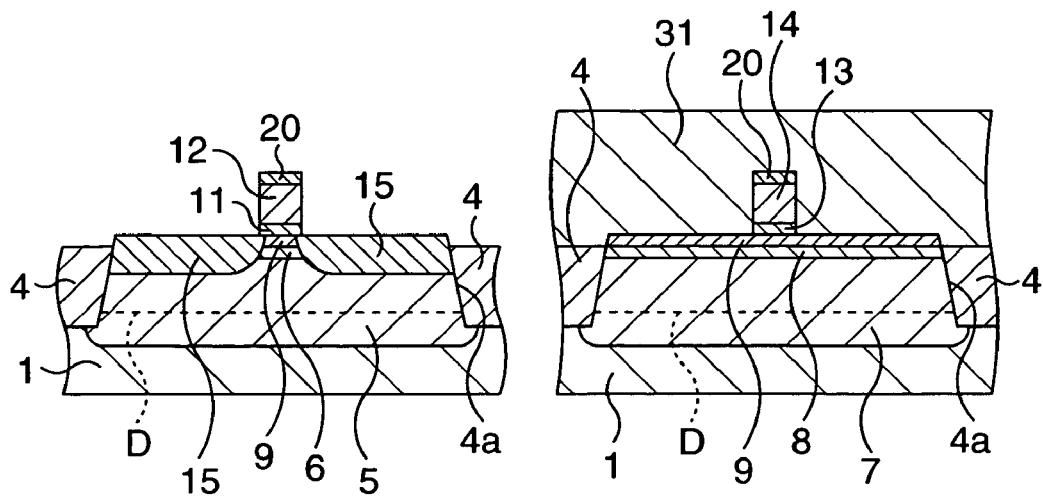
FIGS. 2A to 2C are schematic cross-sectional views illustrating the manufacturing method of CMOS transistors according to the present embodiment in the order of processing, following FIGS. 1A to 1E.

The inventor, having made every endeavor for easily and reliably realizing an ideal step-profile in the channel region, devised the present invention as follows.

First, in order to guarantee a generally complete step-profile condition as the initial state, impurities are introduced into the semiconductor region of a substrate, a channel diffusion layer is formed, and subsequently an impurity-free semiconductor film which is to be the surface layer of the channel region is formed on the channel diffusion layer by a selective epitaxial growth or the like.

Given the above-mentioned initial state, it is necessary to prevent diffusion of impurities by keeping the processing temperature relatively low, in order to maintain the generally complete step-profile of the initial state during the manufacturing process. Among the processes, heat treatment for activating the impurities introduced in the source region and the drain region (and the extension region) typically requires a high temperature in a range of 950° C. to 1050° C. The inventor, paying attention particularly to this point, devised a method using the so-called low temperature solid-phase epitaxial regrowth to perform the impurity activation process at a low temperature.

In this case, the semiconductor region is amorphized to a predetermined depth from the semiconductor film, and impurities are introduced under this condition to become the source region and the drain region (and the extension region). The predetermined depth is required to be deeper than the junction plane of the source and the drain regions with the semiconductor region, from the view point of preventing impurity diffusion also from the source region and the drain region which form a deep junction and achieving high activation rate. Then, by the low temperature solid-phase epitaxial regrowth, for example, the impurities are activated and the amorphous portion is recrystallized. The processing temperature required for the low temperature solid-phase epitaxial regrowth is in a range of 450° C. to 650° C., which can suppress thermal diffusion of the impurities into the semiconductor film. Thus, high impurity activation can be realized, and the initial steep step-profile can be maintained without diffusion of the impurities into the semiconductor surface layer. In this manner, a semiconductor device having a high short-channel tolerance and a superior drive performance can be realized.

Here, the processing temperature is kept at 650° C. or lower also in the gate insulator forming process and the gate electrode forming process, in order to keep the processing temperature low during the entire manufacturing process and to reliably maintain the initial step-profile. As a specific approach, the gate insulator is formed by CVD, for example, using a high dielectric constant material, and the gate electrode is formed by sputtering or CVD, using metal materials. Particularly, when the gate insulator is formed by an ordinary thermal oxidation, a high temperature exceeding 800° C. is required as the processing temperature. On the contrary, when the gate insulator is formed by CVD using a high dielectric constant material, the processing temperature may be equal to or lower than 650° C. Similarly, when the gate electrode is formed by sputtering using metal materials, the processing temperature can also be equal to or lower than 650° C.

Here, a technology for amorphizing the semiconductor substrate after the channel diffusion layer has been formed is disclosed in the Patent Document 1. In this case, however, a P-type channel diffusion layer is formed as the channel diffusion layer, by implanting In ions which are P-type impurities into the substrate surface layer. Then, from the view point of preventing generation of leakage current due to formation of a dislocation loop defect layer resulting from the implantation of heavy In ion which may occur in the interface between the P-type channel diffusion layer and the substrate, the dislocation loop defect layer is, so to speak, depressed downward in the substrate, by amorphizing the deeper portion within the substrate after the formation of the P-type channel diffusion layer.

On the other hand, the present invention is a technology for replacing the channel diffusion layer by a semiconductor film substantially in a non-doped state to reliably achieve the above-mentioned step-profile. Thus, the present invention and the invention of the Patent Document 1 are obviously different.

In addition, although a technology has been developed for amorphizing only the extension region which is partially superimposed with the source region and the drain region and activating the impurities by the low temperature solid-phase epitaxial regrowth, leakage current may also occur due to the dislocation loop defect layer remaining within the channel of the extension region edge, as with the problem in the Patent Document 1.

Specific Embodiments Applying the Present Invention

In the following, based on the above-mentioned basic principle, a specific embodiment applying the present invention to CMOS transistors will be described in detail referring to the drawings. For illustrative purposes, the embodiment with a configuration of CMOS transistors along with its manufacturing method will be described.

FIGS. 1A to 4B are schematic cross-sectional views illustrating the manufacturing method of CMOS transistors according to the present embodiment in the order of processing.

First, as shown in FIG. 1A, an active region 2 of a P-type MOS transistor and an active region 3 of an N-type MOS transistor are defined on a silicon substrate 1.

Specifically, element isolation structures are formed in the element isolation region of the P-type MOS transistor and the element isolation region of the N-type MOS transistor on a semiconductor substrate, here the silicon substrate 1, to define active regions 2 and 3. As the element isolation structure, an STI element isolation structure 4 is formed by STI (Shallow Trench Isolation) method, in which the groove 4a is formed on the element isolation region by lithography and dry etching and it is filled with an insulator such as silicon oxide or the like. Here, instead of forming the STI element isolation structure 4, a field oxide film, for example, may be formed by field oxidizing the element isolation region according to the LOCOS method.

Subsequently, as shown in FIG. 1B, an N-type well 5 and an N-type lower channel layer 6 are formed on the active region 2 of the P-type MOS transistor, and a P-type well 7 and a P-type lower channel layer 8 are formed on the active region 3 of the NMOS transistor.

Specifically, a thin sacrificial oxide film 10 is first formed on the surfaces of the active regions 2 and 3 by thermal oxidation.

Next, a resist mask (not shown) covering only the active region 3 is formed, and an N-type impurity, phosphorus (P) in this case, is ion-implanted into the active region 2 to form an N-type well under conditions such that, for example, the acceleration energy is 400 keV and the dose is $2*10^{13}/cm^2$, and acceleration energy is 150 keV and the dose is $3*10^{12}/cm^2$. Arsenic (As), instead of P, may be used in the ion implantation.

Next, still using the resist mask covering the active region 3, an N-type impurity, arsenic (As) in this case, is ion-implanted into the surface layer of the active region 2 to form an N-type channel layer under conditions such that, for example, the acceleration energy is 80 keV and the dose is $3*10^{12}/cm^2$. Phosphorus (P), instead of As, may be used in the ion implantation.

Next, after the resist mask covering the active region 3 has been removed by ashing or the like, a resist mask (not shown) covering only the active region 2 is formed. Then, using the resist mask, a P-type impurity, boron (B) in this case, is ion-implanted into the active region 3 to form a P-type well under conditions such that, for example, the acceleration energy is 180 keV and the dose is $2*10^{13}/cm^2$, and acceleration energy is 50 keV and the dose is $4*10^{12}/cm^2$.

Next, still using the resist mask covering the active region 2, a P-type impurity, boron (B) in this case, is ion-implanted into the surface layer of the active region 3 to form a P-type channel layer under conditions such that, for example, the acceleration energy is 8 keV and the dose is $5*10^{12}/cm^2$. Here, indium (In), instead of B, may be used in the ion implantation.

Then, the resist mask covering the active region 2 is removed by ashing or the like, followed by heat treatment (annealing) for about 10 seconds at a processing temperature of 1000° C. The annealing activates the ion-implanted impurity, recovers the defects induced by the ion implantation, forming an N-type well 5 and an N-type lower channel layer 6 in the active region 2, and forming a P-type well 7 and a P-type lower channel layer 8 in the active region 3. In addition, the order of forming the active regions (impurity implantation) of P-type and N-type MOS transistors may be reversed.

Subsequently, as shown in FIG. 1C, an upper channel layer 9 in a non-doped state (the impurity concentration being equal to or lower than $1*10^{16}/cm^3$) is formed on the lower channel layers 6 and 8.

Specifically, the sacrificial oxide film 10 of the active regions 2 and 3 is first removed by wet etching, or the like.

Then, by selective epitaxial growth, a semiconductor film in non-doped state, a silicon film in this case, is grown on the lower channel layers 6 and 8 to have a film thickness of about 10 nm, to form an upper channel layer 9.

Subsequently, as shown in FIG. 1D, the semiconductor substrate 1 is amorphized from the upper channel layer 9 to a predetermined depth including the lower channel layers 6 and 8.

Specifically, a relatively heavy element, Ge in this case, is used for implanting into the substrate from the upper channel layer 9 to amorphize the semiconductor substrate 1 from the upper channel layer 9 to a predetermined depth (shown by the dashed line D) including the lower channel layers 6 and 8. Here, the predetermined depth D is required to be deeper than the junction plane of the source regions 17, 22 and the drain regions 18, 23, described below, with the semiconductor substrate 1. In addition, Si or Ar, instead of Ge, may be used in the implantation.

Next, as shown in FIG. 1E, a gate electrode 12 and a cap insulator 20 are formed, through a gate insulator 11, on the upper channel layer 9 in the active region 2 of the P-type MOS transistor, whereas a gate electrode 14 and a cap insulator 20 are formed, through a gate insulator 13, on the upper channel layer 9 in the active region 3 of the N channel MOS transistor.

Specifically, the gate insulators 11 and 13 are formed on the upper channel layer 9 using a high dielectric constant material, (HfSiON) in this case, in the active regions 2 and 3. Here, the gate insulator 11 is formed by CVD, at the processing temperature equal to or lower than 650° C., for example at 450° C. In this case, since the processing temperature is relatively low, i.e., equal to or lower than 650° C., diffusion of impurities in the lower channel layers 6 and 8 to the upper channel layer 9 can be prevented. In addition, as the material of the gate insulator 11, ($HfSiO_2$, $ZrO_2$) or the like may be used instead of (HfSiON).

Next, in the active regions 2 and 3, a silicon oxide film, for example, is deposited as a cap material, after a metal material, (W/TiN) in this case, has been used to deposit a metal film (not shown) on the gate insulators 11 and 13. The metal film is formed by sputtering, for example, at the processing temperature equal to or lower than 650° C., e.g., at 100° C. In this case, since the processing temperature is relatively low, i.e. equal to or lower than 650° C., diffusion of impurities in the lower channel layers 6 and 8 to the upper channel layer 9 can be prevented.

Then, a resist mask (not shown) is formed to open only the gate electrode formation region of the active regions 2 and 3. Using this resist mask, silicon oxide films, metal films and gate insulators 11 and 13 of the active regions 2 and 3, respectively, are patterned. By the patterning, a gate electrode 12 and a cap insulator 20 are patterned in the active region 2 through the gate insulator 11, and a gate electrode 14 and a cap insulator 20 are patterned in the active region 3 through the gate insulator 13.

Next, as shown in FIG. 2A, a P-type extension region 15 is formed on the active region 2 of the P-type MOS transistor.

Specifically, a resist mask 31 covering only the active region 3 is formed, and a P-type impurity, boron (B) in this case, is ion-implanted into the active region 2 under conditions such that, for example, the acceleration energy is 0.5 keV and the dose is $1*10^{15}/cm^2$. In this occasion, a P-type extension region 15 is formed on both sides of the gate electrode 12 in the active region 2, with the cap insulator 20 and the gate electrode 12 acting as a mask. In addition, since the region to be ion-implanted has already been amorphized, increase of the junction depth due to channeling can be prevented.

Figure 2B:
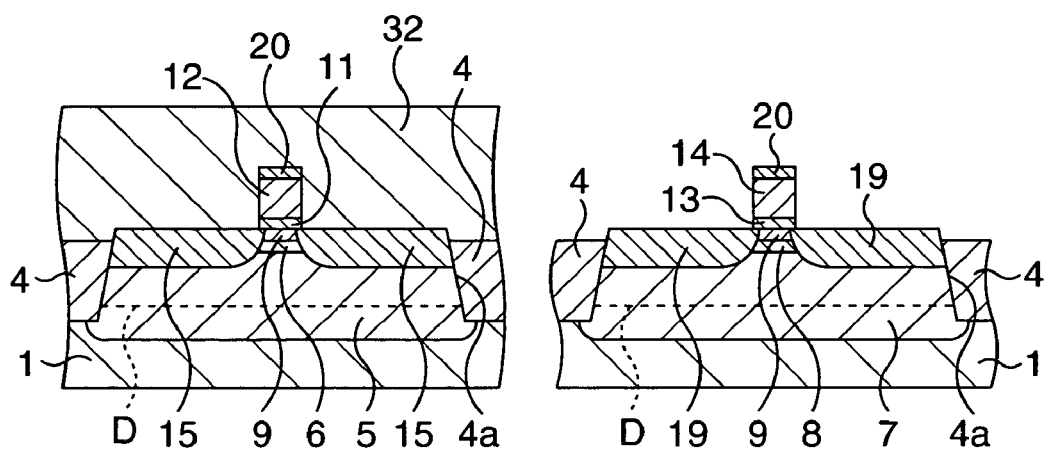

Next, as shown in FIG. 2B, an N-type extension region 19 is formed on the active region 3 of the N-type MOS transistor.

Specifically, after the resist mask 31 covering the active region 3 has been removed by ashing or the like, a resist mask 32 covering only the active region 2 is formed. Then, using the resist mask 32, an N-type impurity, arsenic (As) in this case, is ion-implanted into the active region 3 under conditions such that, for example, the acceleration energy is 5 keV and the dose is $1.5*10^{15}/cm^2$. In this occasion, an N-type extension region 19 is formed on both sides of the gate electrode 14 in the active region 3, with the cap insulator 20 and the gate electrode 14 acting as a mask. In addition, since the region to be ion-implanted has already been amorphized, increase of the junction depth due to channeling can be prevented.

Figure 2C:
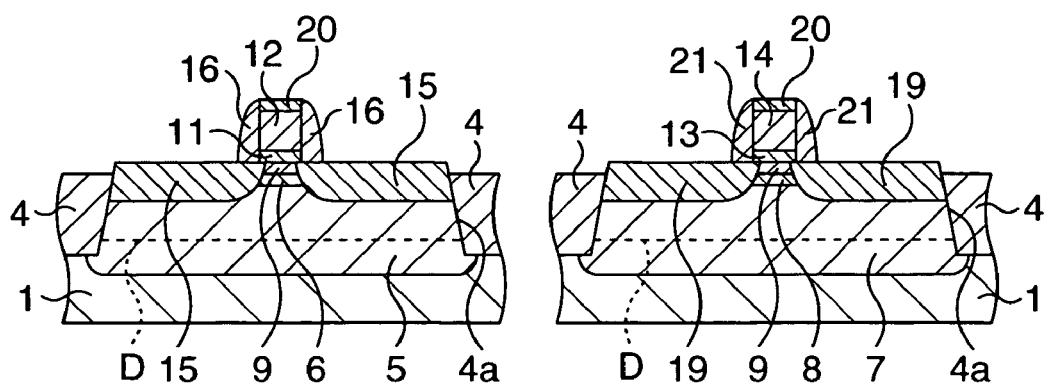

Subsequently, as shown in FIG. 2C, sidewall spacers 16 and 21 are formed simultaneously: the former on both sides of the cap insulator 20 and the gate electrode 12 in the active region 2 of the P-type MOS transistor, the latter on both sides of the cap insulator 20 and the gate electrode 14 in the active region 3 of the N-type MOS transistor.

Specifically, after the resist mask 32 covering the active region 2 has been removed by ashing or the like, an insulator, a silicon oxide film (not shown) in this case, is deposited so as to cover the entire surface of the gate electrodes 12 and 14. Then anisotropic etching (etchback) is performed on the entire surface of the silicon oxide film to form the sidewall spacers 16 and 21, leaving the silicon oxide film only on both sides of the cap insulator 20 and the gate electrode 12 in the active region 2, and only on both sides of the cap insulator 20 and the gate electrode 4 in the active region 3.

Figure 3A:
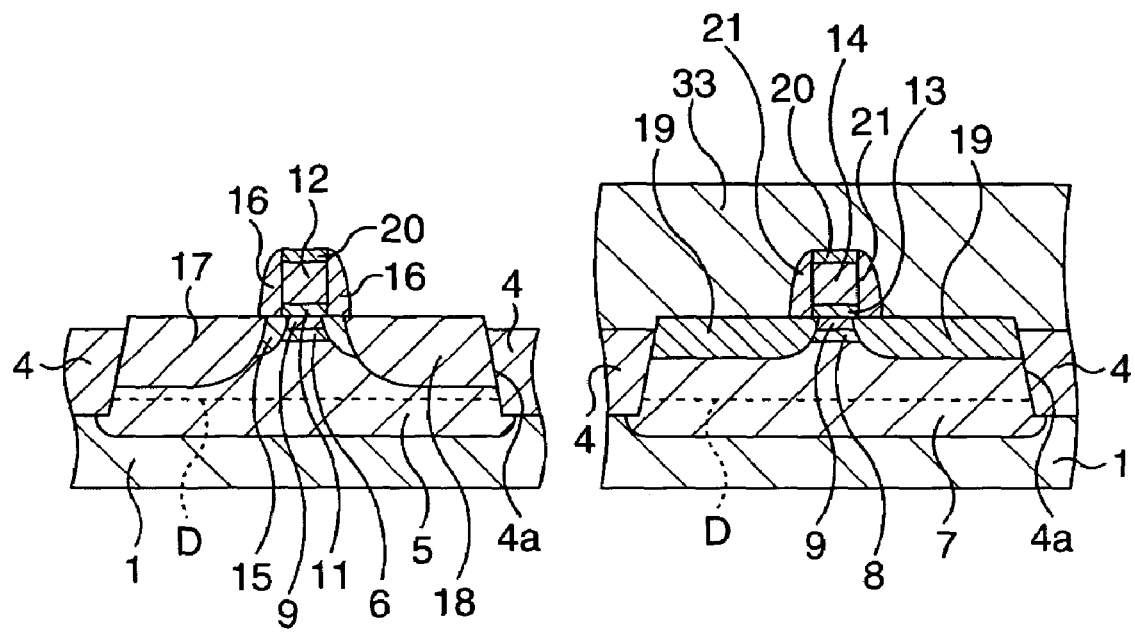
FIGS. 3A and 3B are schematic cross-sectional views illustrating the manufacturing method of CMOS transistors according to the present embodiment in the order of processing, following FIGS. 2A to 2C.

Subsequently, as shown in FIG. 3A, a P-type source region 17 and a drain region 18 are formed on the active region 2 of the P-type MOS transistor.

Specifically, a resist mask 33 covering only the active region 3 is formed, and a P-type impurity, boron (B) in this case, is ion-implanted into the active region 2 under conditions such that, for example, the acceleration energy is 5 keV and the dose is $4*10^{15}/cm^2$. In this occasion, a P-type source region 17 and a drain region 18 deeper than the P-type extension region 15 are formed, so as to be partially superimposed with the extension region 15 at both sides of the sidewall spacer 16 in the active region 2, with the cap insulator 20, the gate electrode 12, and the sidewall spacer 16 acting as a mask. Here, the extension region 15, the source region 17, and the drain region 18 are formed on the amorphized portion because the predetermined depth D of the amorphized portion is deeper than the junction plane of the source region 17 and the drain region 18 with the silicon substrate 1.

Figure 3B:
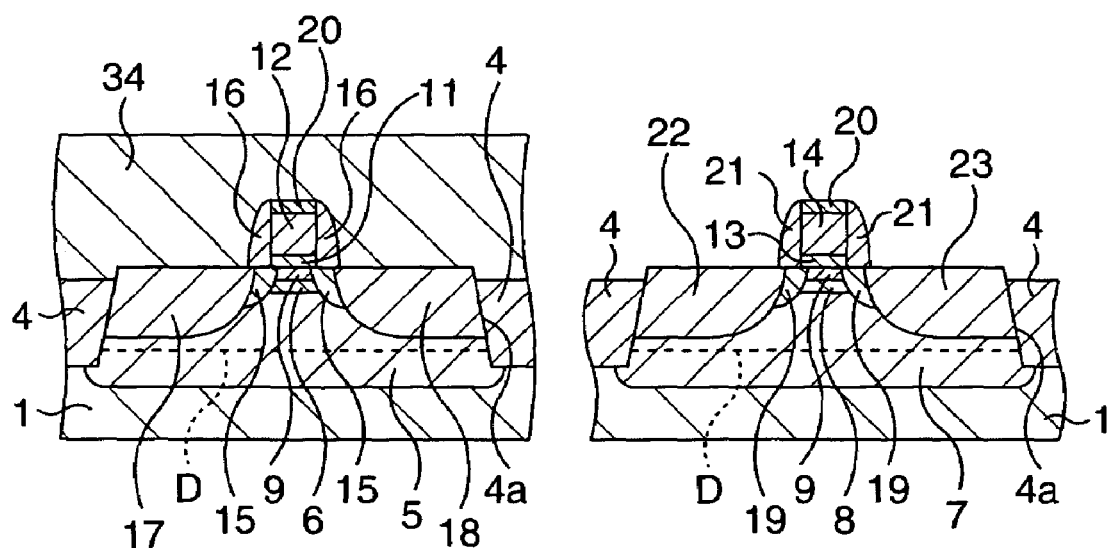

Subsequently, as shown in FIG. 3B, an N-type source region 22 and a drain region 23 are formed on the active region 3 of the N-type MOS transistor.

Specifically, the resist mask 33 covering the active region 3 is removed by ashing or the like, a resist mask 34 covering only the active region 2 is formed, and an N-type impurity, phosphorus (P) in this case, is ion-implanted into the active region 3 under conditions such that, for example, the acceleration energy is 20 keV and the dose is $5*10^{15}/cm^2$. In this occasion, an N-type source region 22 and a drain region 23 deeper than the N-type extension region 19 are formed, so as to be partially superimposed with the extension region 19 at both sides of the sidewall spacer 21 in the active region 3, with the cap insulator 20, the gate electrode 14, and the sidewall spacer 21 acting as a mask. Here, the extension region 19, the source region 22, and the drain region 23 are formed on the amorphized portion because the predetermined depth D of the amorphized portion is deeper than the junction plane of the source region 22 and the drain region 23 with the silicon substrate 1.

Figure 4A:
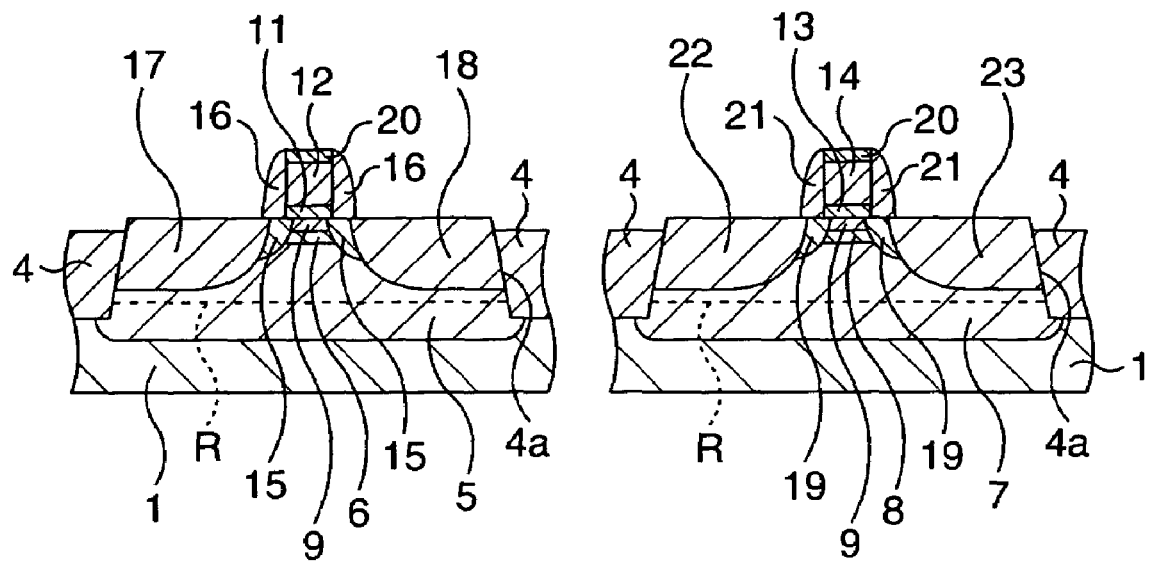
FIGS. 4A and 4B are schematic cross-sectional views illustrating the manufacturing method of CMOS transistors according to the present embodiment in the order of processing, following FIGS. 3A to 3B.

Subsequently, as shown in FIG. 4A, various impurities introduced after the above-mentioned amorphization are activated by low temperature solid-phase epitaxial regrowth, and the amorphized portions are recrystallized.

Specifically, the resist mask 34 covering the active region 2 is first removed by ashing.

Then, at the processing temperature held within a range of 450° C. to 650° C., at 600° C. in this case, various impurities introduced after the above-mentioned amorphization are activated by low temperature solid-phase epitaxial regrowth for 30 minutes, the impurities being acceptors of the extension region 15, the source region 17 and the drain region 18 in the active region 2 and donors of the extension region 19, the source region 22 and the drain region 23 in the active region 3, while the amorphized portion, i.e., the portion of the silicon substrate 1 at and above the predefined depth D (including the lower channel layers 6 and 8) and the upper channel layer 9 are recrystallized. Here, at a location of the predetermined depth D, a residual defect plane (shown by the dashed line R) remains as a history when the amorphized portion was recrystallized.

Here, the time duration of the low temperature solid-phase epitaxial regrowth is preferably as short as possible within a range which allows crystallization of the entire amorphous portion.

In this case, since the processing temperature is relatively low, i.e., equal to or lower than 650° C., diffusion of impurities in the lower channel layers 6 and 8 to the upper channel layer 9 can be prevented. Furthermore, because of the low temperature processing, various impurities in the extension regions 15 and 19, the source regions 17 and 22 and the drains 18 and 23 are sufficiently activated without diffusing to respective upper channel layers 9. Note that, although the order of formation (order of ion implantation) of the extension and the source/drain regions is described here such as the P-type MOSFET being first, followed by the N-type MOSFET, the order may be reversed. Moreover, after the implantation of extension impurities, pocket impurities may be implanted as a punch-through stopper.

Figure 4B:
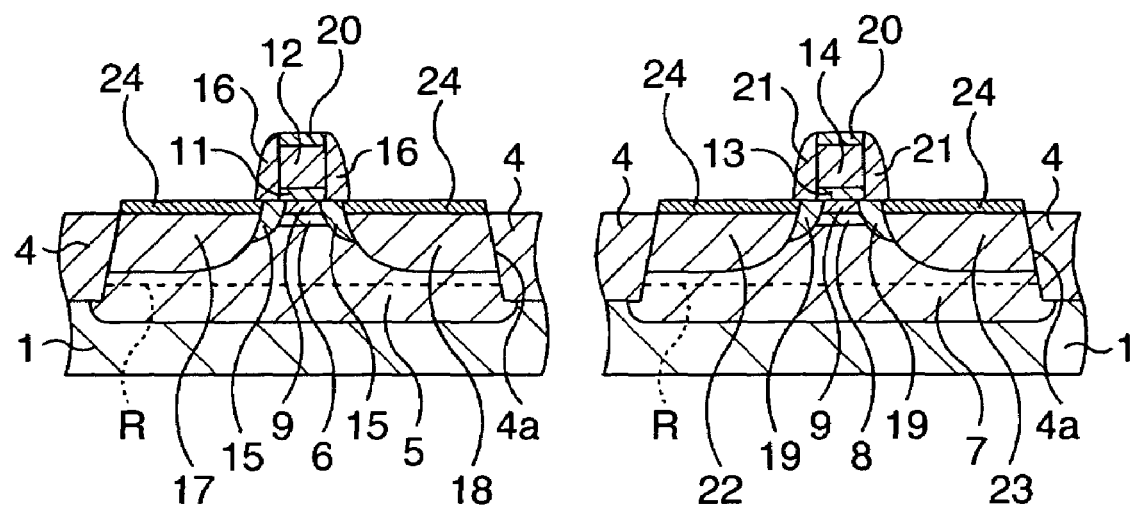

Subsequently, as shown in FIG. 4B, a silicide layer 24 is formed on the source regions 17 and 22, and the drains 18 and 23.

Specifically, metal, for example Co or Ni, is deposited on the entire surface including the active regions 2 and 3, by sputtering or the like, and a silicide layer 24 is formed by performing heat treatment for 30 seconds at a low processing temperature of 650° C. or lower, at 400° C. in this case, and reacting the deposited metal with the silicon on the source regions 17 and 22, and the drains 18 and 23. Then the metal which is not reacted with silicon is removed by wet etching. Furthermore, heat treatment at a low temperature less than 650° C., at 500° C. in this case, is performed for 30 seconds in order to make complete silicide. During this wet etching process, gate electrodes 12 and 14 are protected from being etched due to the existence of the cap insulator 20 upon the gate electrodes 12 and 14.

Subsequently, following the formation of interlayer insulators, various connection holes, and wirings, CMOS transistors are completed having a P-type MOS transistor in the active region 2, and an N-type MOS transistor in the active region 3.

In the present embodiment, the processing temperature is kept low, that is 650° C. or lower, during the entire manufacturing process to activate the impurities and recrystallize the amorphized portion by low temperature solid-phase epitaxial regrowth, whereby thermal diffusion of the impurities into respective upper channel layers 9 is suppressed, resulting in high impurity activation as well as preventing diffusion of the impurities into the respective upper channel layers 9. Therefore, CMOS transistors are completed under a condition such that the initial steep step-profile immediately after the formation of the silicon film to be respective upper channel layers 9 is maintained in the upper channel layer 9 and the lower channel layer 6 of the channel region, i.e., the active region 2, and in the upper channel layer 9 and lower channel layer 8 of the active region 3.

Figure 5:
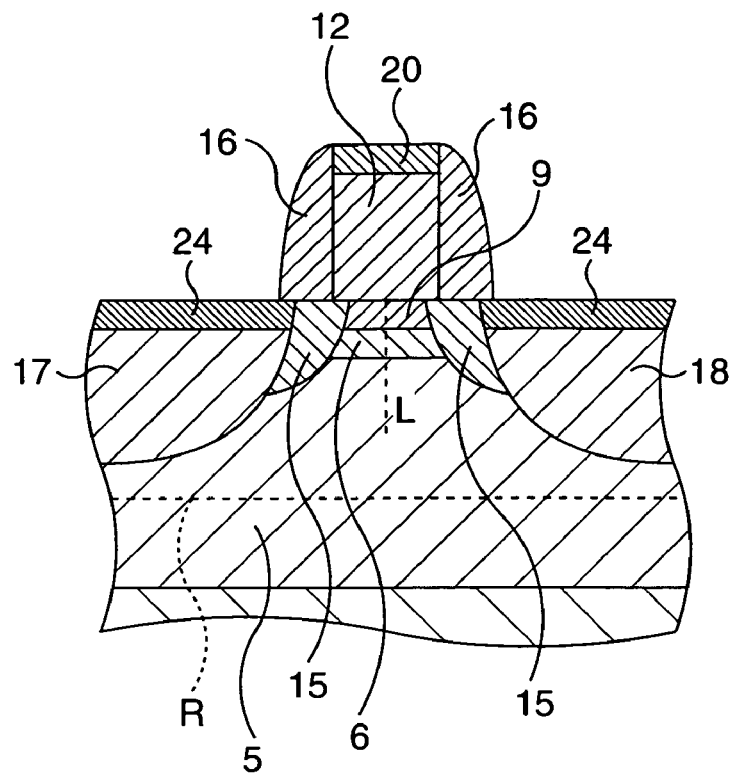
FIG. 5 is a schematic cross-sectional view for describing the impurity concentration distribution in the channel region of CMOS transistors according to the present embodiment.
Figure 6:
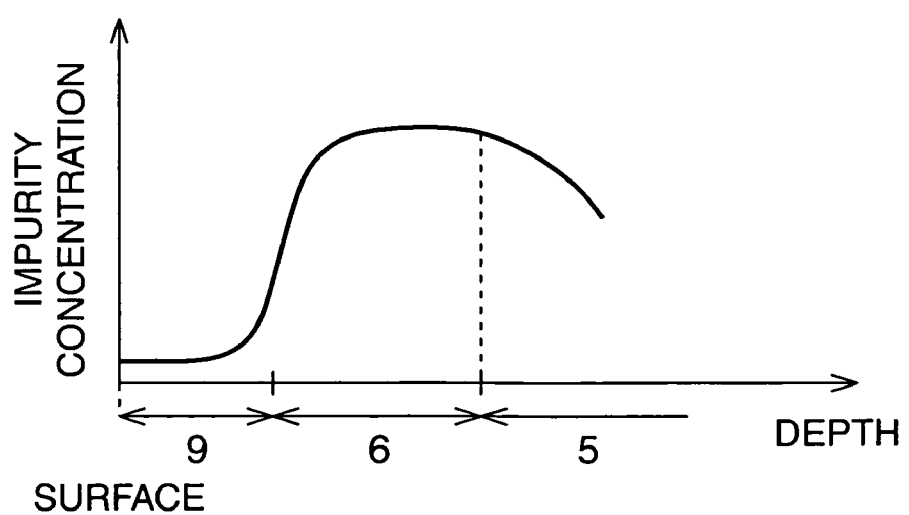
FIG. 6 is a characteristic diagram illustrating the impurity concentration distribution in the channel region of CMOS transistors according to the present embodiment.

As an example, the concentration profile in the channel region of the P-type MOS transistor in the active region 2 was examined. Here, the concentration profile was examined along the depth direction of the channel region of the P-type MOS transistor as the dashed line L shown in FIG. 5 (corresponding to FIG. 4B). As a result, while the impurity concentration of the upper channel layer 9 is extremely low and substantially non-doped (a condition not containing impurities), the impurity concentration of the lower channel layer 6 shows a sufficiently high value, with the impurity concentration of the well 2 gradually decreasing from the impurity concentration of the lower channel layer 6, as shown in FIG. 6. Here, it can be seen that the so-called step-profile is achieved, wherein the impurity concentration drastically changes at the interface between the upper channel layer 9 and the lower channel layer 6.

With the CMOS transistors of the present embodiment, mobility degradation is suppressed because the carrier moves across respective upper channel layers 9 being substantially non-doped, and the short-channel effect is suppressed by the lower channel layers 6 and 8 having a high impurity concentration. As thus described, according to the present embodiment, an ideal step-profile in the channel region can be realized easily and reliably, and suppression of the short-channel effect and prevention of mobility degradation are achieved simultaneously, whereby highly reliable CMOS transistors that can cope with shorter channel-lengths can be obtained.

According to the present invention, a high-level activation of the source/drain impurities and an ideal step-profile in the channel region are easily and repeatably realized, by which both suppression of short-channel effect and prevention of mobility degradation are achieved, and then highly reliable semiconductor devices can be fabricated that can cope with further shortened channel-lengths.

What is claimed is:

1. A manufacturing method of a semiconductor device comprising the processes of:

introducing the first impurities of the first conductivity type into the semiconductor region of a semiconductor substrate, and activating said first impurity;

forming a thin semiconductor film on said semiconductor region;

amorphizing said semiconductor region to a predetermined depth from said semiconductor film;

patterning a gate electrode on said amorphized semiconductor film through a gate insulator;

introducing the second impurities of the second conductivity type into the semiconductor region from said semiconductor film at both sides of said gate electrode, and forming a source region and a drain region;

activating said second impurity introduced, and recrystallizing the amorphized portion of said semiconductor film and said semiconductor region, by performing heat treatment, wherein said semiconductor film in the channel region is substantially not containing impurities and formed so that the concentration of said first impurity increases in a steep, step-wise manner at the interface between semiconductor film and the semiconductor region of the semiconductor substrate, and the steep, step-wise manner is maintained.

2. The manufacturing method of a semiconductor device according to claim 1, wherein said amorphizing process is characterized in amorphizing said semiconductor region to a depth which is deeper than the depth of the interface of said source region and said drain region with said semiconductor substrate.

3. The manufacturing method of a semiconductor device according to claim 1, characterized in forming said gate insulator at a temperature equal to or lower than 650° C.

4. The manufacturing method of a semiconductor device according to claim 3, characterized in forming said gate insulator from any one of HfSiON, $HfSiO_2$, and $ZrO_2$.

5. The manufacturing method of a semiconductor device according to claim 1, characterized in forming said gate electrode at a temperature of equal to or lower than 650° C.

6. The manufacturing method of a semiconductor device according to claim 5, characterized in forming said gate electrode from a metal material.

7. The manufacturing method of a semiconductor device according to claim 1, characterized in forming said semiconductor film by selective epitaxial growth.

* * * * *

UNITED STATES PATENT AND TRADEMARK OFFICE
CERTIFICATE OF CORRECTION

PATENT NO.          : 7,223,646 B2
APPLICATION NO. : 11/192424
DATED                   : May 29, 2007
INVENTOR(S)         : Toshihiko Miyashita et al.

It is certified that error appears in the above-identified patent and that said Letters Patent is hereby corrected as shown below:

On The Title Page:
In item (57) the ABSTRACT change "7 Claims" to be -- 8 claims --

Col. 10 lines 40 - 43:
Insert -- 8.  The manufacturing method of a semiconductor device according to claim 1, characterized in performing said heat treatment at a temperature within a range of 450°C to 650°C. --

Signed and Sealed this

Sixth Day of November, 2007

JON W. DUDAS
*Director of the United States Patent and Trademark Office*